US 6,724,129 B2

(12) United States Patent
Nakatani

(10) Patent No.: US 6,724,129 B2
(45) Date of Patent: Apr. 20, 2004

(54) LAMINATED PIEZOELECTRIC ELEMENT, METHOD FOR MANUFACTURING THE SAME, AND PIEZOELECTRIC ACTUATOR

(75) Inventor: Hiroshi Nakatani, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/179,238

(22) Filed: Jun. 26, 2002

(65) Prior Publication Data
US 2003/0020364 A1 Jan. 30, 2003

(30) Foreign Application Priority Data
Jul. 24, 2001 (JP) ........................................ 2001-223399

(51) Int. Cl.[7] .............................................. H01I 14/083
(52) U.S. Cl. ........................................ 310/328; 310/366
(58) Field of Search ................................ 310/328, 366, 310/334, 322; 347/70; 29/25.35; H01I 41/083

(56) References Cited

U.S. PATENT DOCUMENTS 5,834,880 A * 11/1998 Venkataramani et al. ... 310/334
5,912,526 A * 6/1999 Okawa et al. ............... 310/328
5,983,471 A * 11/1999 Osawa ........................ 310/328
6,140,749 A   10/2000 Nakatani
6,222,303 B1 * 4/2001 Nakamura et al. .......... 310/328
6,409,320 B1 * 6/2002 Kurihara et al. ............. 347/68
6,623,111 B2 * 9/2003 Nakatani ..................... 310/328

FOREIGN PATENT DOCUMENTS

JP          11-320881         11/1999

* cited by examiner

Primary Examiner—Thomas M. Dougherty
Assistant Examiner—Karen Beth Addison
(74) Attorney, Agent, or Firm—Keating & Bennett, LLP

(57) ABSTRACT

A laminated piezoelectric element includes a second connecting internal electrode electrically connected to a common external electrode that is located in a bottom portion, which lies below the bottoms of slits, of a monolithic piezoelectric body, and the second connecting internal electrode is spaced away from and substantially parallel to the first and second driving internal electrodes. In the laminated piezoelectric element, a notch is formed on a side surface of the monolithic piezoelectric body, having a driving external electrode and a connecting external electrode disposed thereon, and a conducting external electrode is disposed on the side surface of the notch, having an end of the second internal electrode exposed thereat.

16 Claims, 14 Drawing Sheets

LAMINATED PIEZOELECTRIC ELEMENT, METHOD FOR MANUFACTURING THE SAME, AND PIEZOELECTRIC ACTUATOR

BACKGROUND OF THE INVENTION

1. Field of the Invention

The present invention relates to laminated piezoelectric elements and methods for manufacturing the same, and more particularly, to a laminated piezoelectric element used for manufacturing a piezoelectric actuator including a plurality of independently driven actuator units.

2. Description of the Related Art

In general, print heads mounted on inkjet-type printers are driven by piezoelectric actuators. An example of a known piezoelectric actuator is disclosed in Japanese Unexamined Patent Application Publication No. 11-320881, which includes a laminated piezoelectric element having an external shape illustrated in FIGS. 12A and 12B.

A laminated piezoelectric element 31 includes a monolithic piezoelectric body 37, i.e., a sintered ceramic compact, which includes a driver 34 having a plurality of first driving internal electrodes 32 and a plurality of second driving internal electrodes 33, the first and second driving internal electrodes being alternatively laminated with a piezoelectric layer interposed therebetween, and which includes a connector 36 having a plurality of laminated connecting internal electrodes 35, with adjacent electrodes having a piezoelectric layer interposed therebetween. Since the piezoelectric layers in the driver 34 of the monolithic piezoelectric body 37 are polarized, the piezoelectric layers expand and contract in the laminating direction X indicated in FIG. 12A, i.e., in a so-called d-33 direction thereof when an alternating voltage is applied thereto.

As shown in FIG. 12A, ends of the first driving internal electrodes 32 are exposed at one of the mutually opposing side surfaces, i.e., only at a first side surface 37a, but the other ends are not exposed at the other side surface, i.e., at a second side surface 37b of the monolithic piezoelectric body 37. Also, as shown in FIG. 12B, ends of the second driving internal electrode 33 are exposed at the second side surface 37b, but the other ends are not exposed at the first side surface 37a. Ends of the connecting internal electrodes 35 are exposed at both of the first and second side surfaces 37a and 37b.

The monolithic piezoelectric body 37 includes a driving external electrode 38 and a connecting external electrode 39, arranged in parallel on the first side surface 37a with a spacing 40 interposed therebetween. The driving external electrode 38 and the connecting external electrode 39 are electrically connected to each of the first driving internal electrodes 32 and each of the connecting internal electrodes 35, respectively. The monolithic piezoelectric body 37 includes a common external electrode 41 provided on substantially the entire second side surface 37b and electrically connected to both the second driving internal electrodes 33 and the connecting internal electrodes 35.

Although the common external electrode 41 is provided on substantially the entire second side surface 37b, the driving external electrode 38 and the connecting external electrode 39 are provided on the first side surface 37a, each having a spacing 42 having a desired width on the bottom of the first side surface 37a, that is, each having the spacing 42 so as to be spaced away from the edge of the lower surface of the monolithic piezoelectric body 37. Thus, the driver 34 has a sectional structure illustrated in FIG. 13.

A piezoelectric actuator 45 having an external shape illustrated in FIGS. 14A and 14B is made using the laminated piezoelectric element 31. More particularly, the laminated piezoelectric element 31 is fixed on a support plate 46 with an adhesive or other suitable material, and the driver 34 includes a plurality of slits 47 formed by cutting from the upper surface toward the lower surface thereof in the laminating direction X.

As shown in FIG. 14A, the slits 47 divide each of the first and second driving internal electrodes 32 and 33, and also divide the driving external electrode 38, such that the driver 34 is divided into a plurality of portions. Thus, the divided driver 34 includes a plurality of independently driven actuator units 48 arranged therein.

In addition, a plurality of unit external electrodes 49 is provided by dividing the driving external electrode 38, wherein the unit external electrodes 49 correspond to the respective actuator units 48. The driver 34 and the connector 36 of the piezoelectric actuator 45 are divided by the slit 47, and FIG. 14B illustrates the piezoelectric actuator 45 viewed from the other side of thereof.

Furthermore, although not shown, a flexible wiring substrate associated with a drive signal source disposed outside is connected to the piezoelectric actuator 45 having the actuator units 48 provided therein. When voltages having independent polarities are applied between the corresponding unit external electrodes 49 and the common external electrode 41, that is, in practice, between the corresponding unit external electrodes 49 and the connecting external electrode 39 connected to the common external electrode 41 via the corresponding connecting internal electrodes 35, each of the actuator units 48 is driven independently of each other.

When the piezoelectric actuator 45 is made from the laminated piezoelectric element 31, the plurality of slits 47 is formed by cutting the driver 34 from the upper surface toward the lower surface of the monolithic piezoelectric body 37 in the laminating direction X so as to divide each of the first and second driving internal electrodes 32 and 33, and also divide the driving external electrode 38. In this case, the slits 47 are generally formed by making a deep cut close to the lower surface of the monolithic piezoelectric body 37 since the first and second driving internal electrodes 32 and 33 and also the driving external electrode 38 must be reliably divided.

On the other hand, since the top portion and the bottom portion of the monolithic piezoelectric body 37, which extend perpendicular to the laminating direction X, that is, the top portion and the bottom portion located above and below the first and second driving internal electrodes 32 and 33 are piezoelectrically inactive, these upper and lower portions have thicknesses that are as small as possible to further reduce the size of the laminated piezoelectric element 31. Accordingly, when the slits 47 are formed deeply, the common external electrode 41 provided on the second side surface 37b has a conducting path 41a which is sandwiched between the lower edges of the slits 47 and the lower surface of the monolithic piezoelectric body 37 and which is as narrow as, for example, about 0.1 mm to 0.2 mm.

The narrow conducting path 41a increases the electrical resistance between any two of the actuator units 48, which decreases the conductivity of the overall piezoelectric actuator 45. Further, the narrow conducting path 41a often has a disconnection because a driving current from the drive signal source flows in the conducting path 41a in a concentrated manner.

SUMMARY OF THE INVENTION

In order to overcome the above-described problems, preferred embodiments of the present invention provide a laminated piezoelectric element in which the electrical resistance of a conducting path of a piezoelectric actuator does not increase and in which the conductivity of the piezoelectric actuator increases even when the conducting path of the common external electrode is narrow, and a method for manufacturing such a novel laminated piezoelectric element.

In accordance with a first preferred embodiment of the present invention, a laminated piezoelectric element includes a monolithic piezoelectric body having at least one slit, and a plurality of independently driven actuator units. The monolithic piezoelectric body includes a driver, and a connector. The driver includes a plurality of first driving internal electrodes, and a plurality of second driving internal electrodes, the first and second driving internal electrodes being alternatively laminated therein. The connector includes a plurality of first connecting internal electrodes laminated therein. The monolithic piezoelectric body further includes a driving external electrode, a connecting external electrode, the driving and connecting external electrodes are arranged substantially parallel to each other on one of the mutually opposing side surfaces of the monolithic piezoelectric body and electrically connected to at least the first driving internal electrodes and the first connecting internal electrodes, respectively, a common external electrode provided on the other side thereof and electrically connected to at least both the second driving internal electrodes and the first connecting internal electrodes, and a second connecting electrode electrically connected to the common external electrode. The silt extends from the upper surface toward the lower surface of the monolithic piezoelectric body in the laminating direction thereof. The actuator units are defined by dividing the driving internal electrodes and the driving external electrode with the silt. The second connecting internal electrode is provided at a bottom portion which is below the bottom edge of the slit, of the monolithic piezoelectric body, and is spaced from and substantially parallel to the driving internal electrodes.

In this configuration, the second connecting internal electrode is not divided by the slit and the second connecting internal electrode that is electrically connected to the common external electrode is provided in the bottom portion of the monolithic piezoelectric body. Thus, the electrical connection between any two of the actuator units is maintained by the second connecting internal electrode even when the width a conducting path of the common external electrode is reduced by forming the slit by cutting. Accordingly, the conductivity of the overall piezoelectric actuator does not decrease as a result of an increase in electrical resistance between any two of the actuator units and also the conducting path of the common external electrode is not broken.

In the laminated piezoelectric element, the first and second driving internal electrodes are preferably defined by printed patterns which are flat and have substantially the same shape, and the second connecting internal electrode is also defined by a printed pattern which is flat and has substantially the same shape as that of the driving internal electrodes. Further, in the laminated piezoelectric element, the second connecting internal electrode is flat and has a shape substantially the same as that of the second driving internal electrodes. That is, these configurations allow the conductivity of the piezoelectric actuator to be sufficiently and reliably maintained since the second internal electrode has a sufficient cross sectional area.

The laminated piezoelectric element preferably further includes a notch provided on a side surface of the monolithic piezoelectric body that includes the driving external electrode and the connecting external electrode provided thereon, and a conducting external electrode which is electrically connected to the second connecting internal electrode and which is provided on the side surface of the notch. The notch extends from the lower surface of the monolithic piezoelectric body upward beyond the bottom edge of the slits, but does not extend to the first and second driving internal electrodes, substantially parallel to the driving internal electrodes and the first connecting internal electrodes. In addition, one end of the second connecting internal electrode is exposed at the side surface of the notch.

With this configuration, the notch is provided along the bottom edge of the side surface, on which the driving external electrode and the connecting external electrode are provided, of the monolithic piezoelectric body, and also the conducting external electrode that is electrically connected to the second connecting internal electrode is provided on the side surface of the notch. As a result, the electrical connection between any two of the actuator units is maintained not only through the second connecting internal electrode but also through the conducting external electrode electrically connected to the second connecting internal electrode, thereby achieving further improved conductivity of the piezoelectric actuator.

In accordance with a second preferred embodiment of the present invention, a method for manufacturing the laminated piezoelectric element according to the first preferred embodiment includes the steps of supporting the monolithic piezoelectric body, having the notch provided therein, in a slanted state with respect to a depositing source or a sputtering source, and forming the driving external electrode, the connecting external electrode, and the conducting external electrode at a job lot. With this method, the conducting external electrodes are easily formed on the side surface of the notch provided in the monolithic piezoelectric body, and the conducting external electrodes are formed at the same time as the driving external electrodes and the connecting external electrodes for a plurality of the monolithic piezoelectric bodies, thereby offering an advantage in which an additional step is not needed for forming these external electrodes, that is, productivity of the laminated piezoelectric elements is greatly improved.

In accordance with a third preferred embodiment of the present invention, a piezoelectric actuator is manufactured by using the laminated piezoelectric element according to the first preferred embodiment, wherein the driver of the monolithic piezoelectric body is divided by the slit formed by cutting from the upper surface toward the lower surface of the monolithic piezoelectric body, and the plurality of independently driven actuator units is configured by dividing the first and second driving internal electrodes, which are laminated in the driver, with the slit.

Other features, elements, characteristics and advantages of the present invention will become more apparent from the following detailed description of preferred embodiments thereof with reference to the attached drawings.

DETAILED DESCRIPTION OF PREFERRED EMBODIMENTS

The present invention will now be described with reference to the accompanying drawings.

Figure 1A:
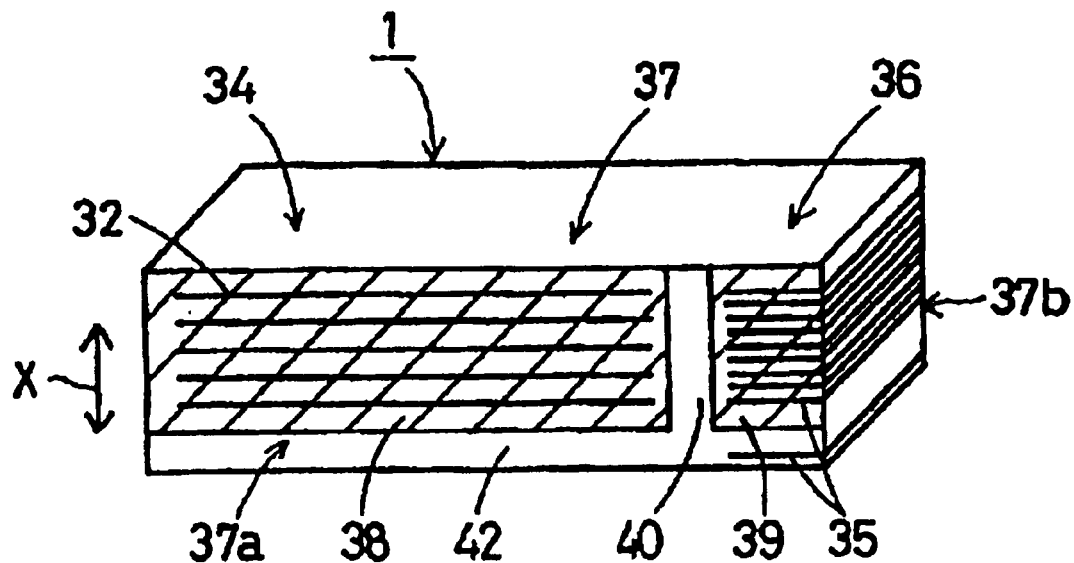
FIGS. 1A and 1B illustrate perspective views of an external shape of a first laminated piezoelectric element according to a first preferred embodiment of the present invention.
Figure 1B:
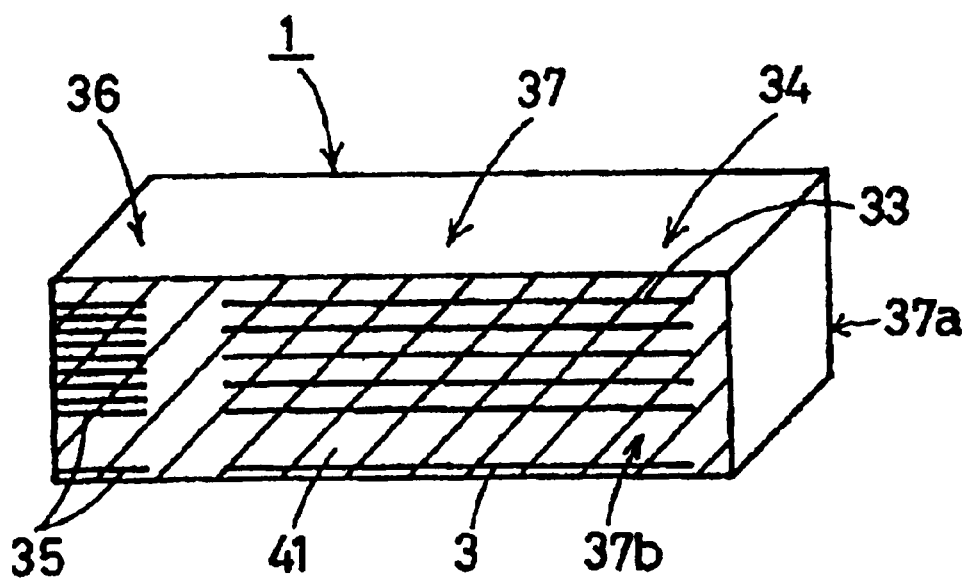
Figure 2:
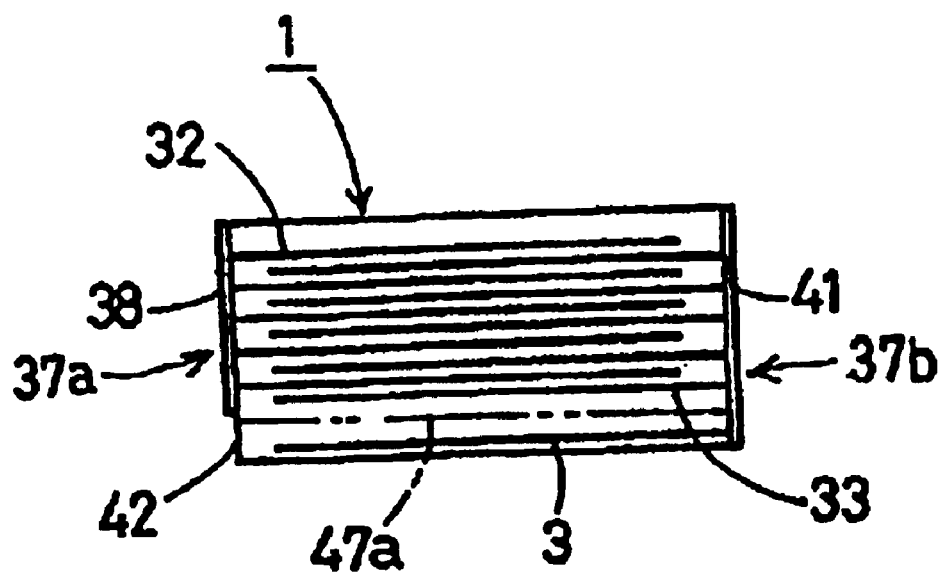
FIG. 2 is a cross sectional view of a first drive of the first laminated piezoelectric element of FIG. 1.
Figure 3A:
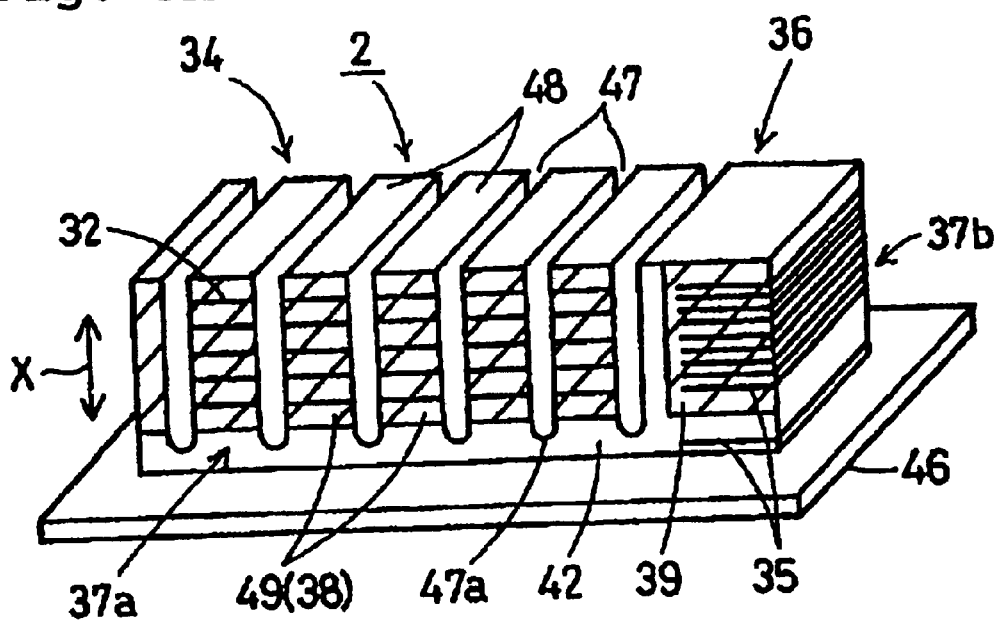
FIGS. 3A and 3B illustrate perspective views of a first piezoelectric actuator including the first laminated piezoelectric element of FIG. 1.
Figure 3B:
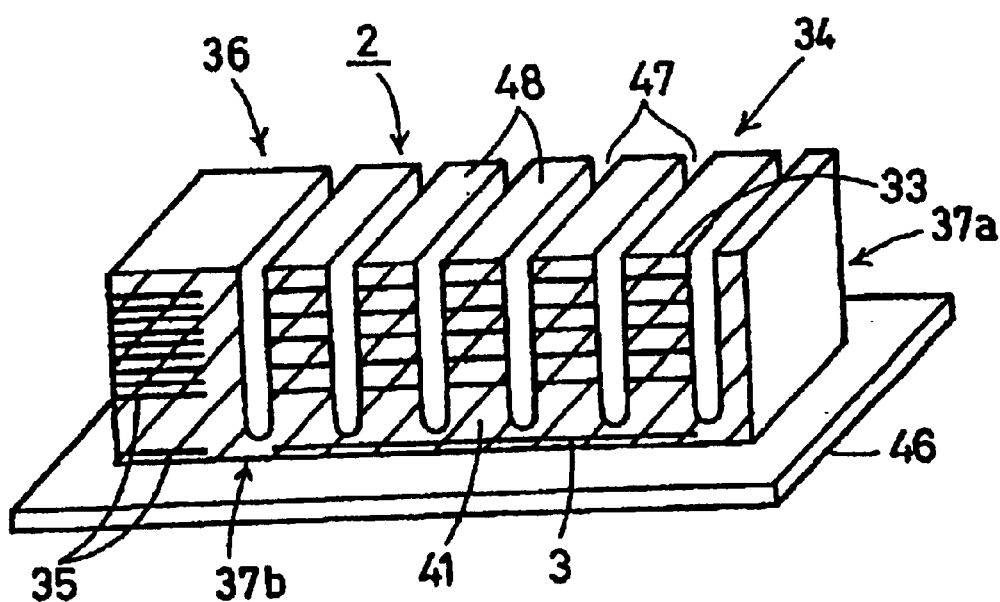

FIGS. 1A and 1B illustrate perspective views of an external shape of a first laminated piezoelectric element according to a first preferred embodiment of the present invention, FIG. 2 is a cross sectional view of a driver of the first laminated piezoelectric element, and FIGS. 3A and 3B illustrate perspective views of a first piezoelectric actuator manufactured to include the laminated piezoelectric element according to the first preferred embodiment. Here, reference numerals 1, 2, and 3 in these drawings denote the laminated piezoelectric element, the piezoelectric actuator, and a second connecting internal electrode, respectively. Since the overall structure of the laminated piezoelectric element according to the first preferred embodiment is basically the same as that of a known laminated piezoelectric element except for the second connecting internal electrode formed therein, like elements or corresponding elements in FIGS. 1A to 3B are denoted by the same reference numerals in FIGS. 12A to 14b.

A laminated piezoelectric element 1 according to the first preferred embodiment is preferably used to manufacture a piezoelectric actuator 2. As shown in FIGS. 1A and 1B, the laminated piezoelectric element 1 includes a monolithic piezoelectric body 37, i.e., a sintered ceramic compact, wherein the monolithic piezoelectric body 37 includes a driver 34 having a plurality of first driving internal electrodes 32 and a plurality of second driving internal electrodes 33, the first and second driving internal electrodes being alternatively laminated with a piezoelectric layer interposed therebetween, and also includes a connector 36 having a plurality of laminated first connecting internal electrodes 35, adjacent electrodes having a piezoelectric layer interposed therebetween. As shown in FIG. 1A, which illustrates the laminated piezoelectric element 1 viewed from one side thereof, ends of the first driving internal electrodes 32 laminated in the driver 34 of the monolithic piezoelectric body 37 are exposed at one of the mutually opposing side surfaces, i.e., at a first side surface 37a, but the other ends are not exposed at a second side surface 37b of the monolithic piezoelectric body 37.

Also, as shown in FIG. 1B, which illustrates the laminated piezoelectric element 1 viewed from the other side thereof, ends of the second driving internal electrodes 33 are exposed at the second side surface 37b, but the other ends are not exposed at the first side surface 37a. The ends of the first connecting internal electrodes 35 are exposed at both the first and second side surfaces 37a and 37b.

The monolithic piezoelectric body 37 has a second connecting internal electrode 3 disposed in a bottom portion of the driver 34 and is arranged substantially perpendicular to the laminating direction X indicated in FIG. 1A, i.e., in the bottom portion lying below the first and second driving internal electrodes 32 and 33. More particularly, the second connecting internal electrode 3 is disposed in the bottom portion of the monolithic piezoelectric body 37, wherein the bottom portion lies below bottoms 47a of slits 47 formed by cutting when the piezoelectric actuator 2 is being manufactured, and is disposed so as to be spaced away from and substantially parallel to the first and second driving internal electrodes 32 and 33.

The second connecting internal electrode 3 generally has a width of about several millimeters in a similar fashion as that of the first and second driving internal electrodes 32 and 33. Although the second connecting internal electrode 3 has only one layer in FIGS. 1A to 3B, it may also have a plurality of layers, and one skilled in the art will appreciate that it preferably has at least one layer.

The second connecting internal electrode 3 is flat and has a shape that is substantially the same as that of the second driving internal electrodes 33. An end of the second connecting internal electrode 3 is exposed at the second side surface 37b, but the other end is not exposed at the first side surface 37a. As shown in FIG. 1B, one of the first connecting internal electrodes 35 may be disposed on the same plane as and substantially parallel to the second connecting internal electrode 3.

Also, the monolithic piezoelectric body 37 has a driving external electrode 38 and a connecting external electrode 39, which are substantially parallel to each other on the first side surface 37a with a spacing 40 interposed therebetween. The driving external electrode 38 and the connecting external electrode 39 are respectively in electrical connection with each of the first driving internal electrodes 32 and each of the first connecting internal electrodes 35. In addition, the monolithic piezoelectric body 37 has a common external electrode 41 disposed on substantially the whole second side surface 37b in common electrical connection with not only the second driving internal electrodes 33 but also the first and second connecting internal electrodes 35 and 3.

Thus, the common external electrode 41 is connected to the connecting external electrode 39 disposed on the first side surface 37a via the first connecting internal electrodes 35 laminated in the connector 36. Consequently, the driver 34 of the laminated piezoelectric element 1 according to the first preferred embodiment has a sectional structure as shown in FIG. 2. A phantom line drawn in FIG. 2 indicates the position that is supposed to be the bottoms 47a of the silts 47, which are formed by cutting when the piezoelectric actuator 2 is being manufactured.

According to the known method, the piezoelectric actuator 2 having an external shape illustrated in FIGS. 3A and 3B is manufactured to include the laminated piezoelectric element 1. More particularly, the piezoelectric actuator 2 has a configuration in which the driver 34 of the laminated piezoelectric element 1 fixed on a support plate 46 with an adhesive or other suitable material or member is divided by the slits 47 formed by cutting from the upper surface toward the lower surface thereof in the laminating direction X. Since the first and second driving internal electrodes 32 and 33 are divided by the slits 47, the driver 34 of the monolithic piezoelectric body 37 offers a plurality of independently driven actuator units 48.

As shown in FIG. 3A, which illustrates the piezoelectric actuator 2 viewed from one side thereof, the driving external electrode 38 is also divided by the slits 47. By dividing the driving external electrode 38, a plurality of unit external electrodes 49 corresponding to the respective individualized actuator units 48 is configured in the actuator unit 45. It will be appreciated that the driver 34 and the connector 36 of the piezoelectric actuator 2 may be divided by the slit 47. FIG. 3B illustrates the piezoelectric actuator 2, having such a configuration, viewed from the other side of thereof.

Furthermore, though not shown, a flexible wiring substrate connecting to a drive signal source disposed outside is connected to the piezoelectric actuator 2 having the actuator units 48 therein. Alternating voltages are applied between the respective unit external electrodes 49 and the common external electrode 41, i.e., practically between the respective unit external electrodes 49 and the connecting external electrode 39 connected to the common external electrode 41 via the connecting internal electrodes 35. Thus, each of the actuator units 48 constituting the piezoelectric actuator 2 is driven independently of each other.

In other words, in the piezoelectric actuator 2 including the laminated piezoelectric element 1, there is no risk of causing the second connecting internal electrode 3 disposed at the bottom portion of the monolithic piezoelectric body 37 and electrically connected to the common external electrode 41 to be divided by the slits 47. Accordingly, even when a conducting path 41a of the common external electrode 41 becomes narrow by forming the slits 47 by cutting, the second connecting internal electrode 3 maintains the electrical connection between any two of the actuator units 48. As a result, there is no risk of an increase in electrical resistance between any two of the actuator units 48 and a decrease in conductivity of the overall piezoelectric actuator 2.

In the description according to the first preferred embodiment, the second connecting internal electrode 3 is configured so as to be flat and have a shape that is substantially the same as that of the second driving internal electrodes 33, that is, so as to have a width of several millimeters, however, the second connecting internal electrode 3 is not limited to such a configuration and one skilled in the art will appreciate that it may have a width smaller than that of the second driving internal electrodes 33 as long as it is electrically connected to the common external electrode 41. When these internal electrodes 3 and 33 have substantially the same width as each other, the second connecting internal electrode 3 has a sufficient cross-section, thereby reliably providing the piezoelectric actuator 2 with sufficient conductivity.

Figure 4:
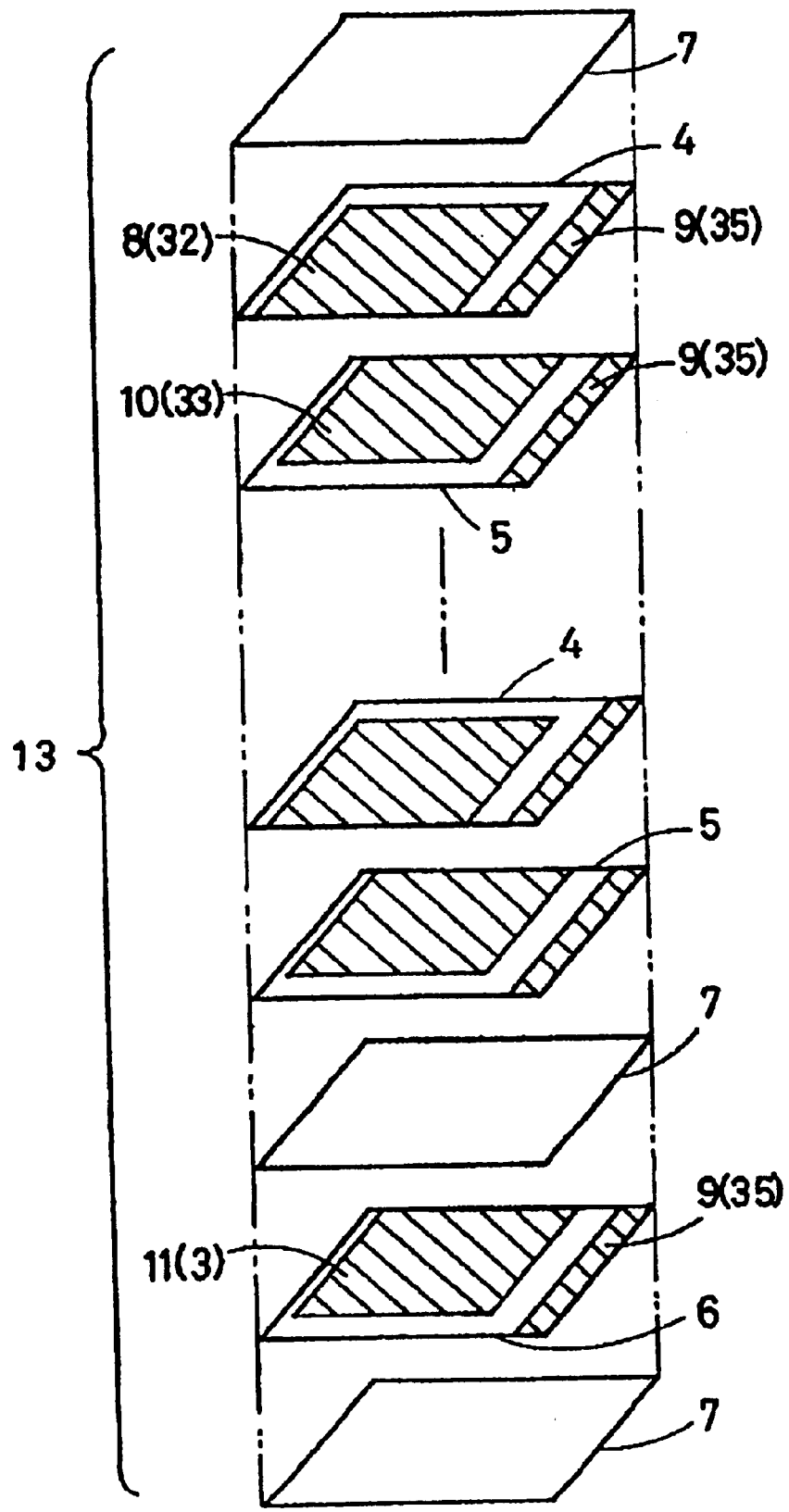
FIG. 4 is an exploded perspective view illustrating a method for manufacturing a monolithic piezoelectric body for the first laminated piezoelectric element of FIG. 1.
Figure 5:
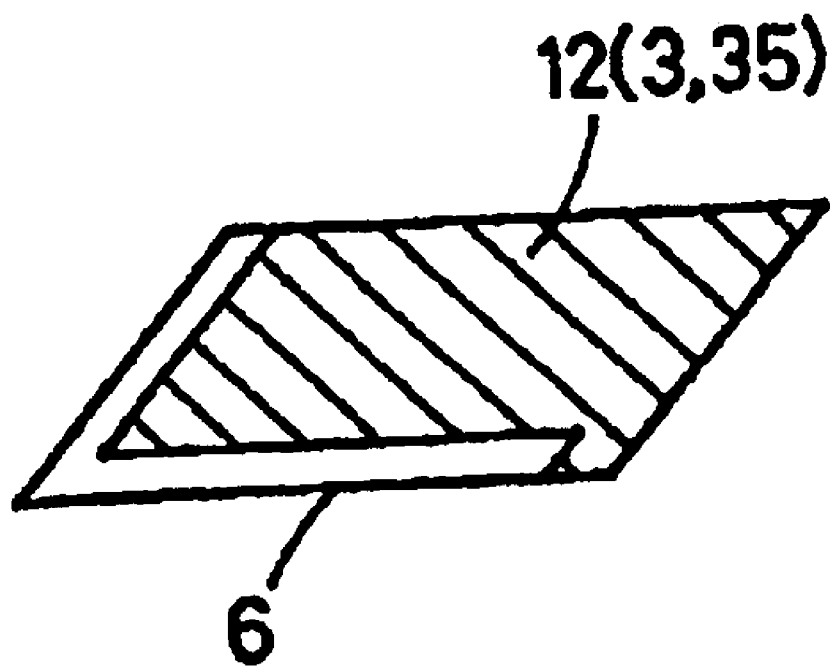
FIG. 5 is an illustration of a modification of the method for manufacturing a monolithic piezoelectric body for the first laminated piezoelectric element of FIG. 1.

Referring now to FIGS. 4 and 5, a method for manufacturing the laminated piezoelectric element 1 according to the first preferred embodiment will be described. FIG. 4 is an exploded perspective view illustrating a method for manufacturing a monolithic piezoelectric body for defining the first laminated piezoelectric element, and FIG. 5 is an illustration of a modification of the method.

When the monolithic piezoelectric body 37 is being manufactured, first green sheets 4 to 7 shown in FIG. 4 are prepared. More particularly, the following four green sheets are prepared, that is, (1) the green sheet 4 having conductive patterns 8 and 9, which are to define the first driving internal electrode 32 and the first connecting internal electrode 35, respectively, and which are arranged substantially parallel to each other thereon, (2) the green sheet 5 having conductive patterns 9 and 10, which are to define the first connecting internal electrode 35 and the second driving internal electrode 33, respectively, and which are disposed substantially parallel to each other thereon, (3) the green sheet 6 having conductive patterns 9 and 11, which are to define the first connecting internal electrode 35 and the second connecting electrode 3, respectively, and which are disposed substantially parallel to each other thereon, and (4) the plain green sheet 7 having no conductive pattern are prepared.

When the second connecting internal electrode 3 is flat and has a shape with substantially the same width as that of the second driving internal electrode 33, the conductive patterns 10 and 11 are substantially identical to each other, and accordingly the green sheets 5 and 6 are substantially identical to each other. Although the conductive pattern 9 which is to define the first connecting internal electrode 35 and the conductive pattern 11 which is to define the second connecting internal electrode 3 are disposed on the green sheet 6 separately from each other, a conductive pattern 12 which is to define the first connecting internal electrode 35 and the second connecting internal electrode 3 may be formed integrally as shown in FIG. 5.

That is, such a conductive pattern 12 offers an advantage wherein the electrical resistance between the first connecting internal electrode 35 and the second connecting internal electrode 3, which are formed integrally, is smaller than that between the internal electrodes 3 and 35 which are formed separately from each other. The green sheets 4 to 7 are preferably substantially rectangular in plan view and are preferably made of a piezoelectric material such as PZT (lead zirconate titanate). The conductive patterns 8 to 11 are preferably printed patterns formed by screen-printing with a conductive paste mainly including Ag or other suitable material.

Each of the conductive patterns 10 and 11 extends to one long side of each of the green sheets 5 and 6, but does not extend to the other long side thereof, respectively. Also, the conductive pattern 9 extends to both long sides of the respective green sheets 4 to 6, while the conductive pattern 8 does not extend to one long side of the green sheet 4 and extends to the other long side thereof.

The conductive patterns 8, 10, and 11 can be formed by finely displacing the foregoing identical patterns. More particularly, in the laminated piezoelectric element 1 according to the first preferred embodiment, the first and second driving internal electrodes 32 and 33 are preferably formed from the conductive printed patterns 8 and 10, both of which are flat and have substantially the same shape as each other, and the second connecting internal electrode 3 is also formed from the conductive printed pattern 11, which is flat and has substantially the same shape as that of the driving internal electrodes 32 and 33.

Subsequently, when a set of the green sheets 4 to 7 are laminated repeatedly set by set having the prescribed number of sheets according to the procedure illustrated in FIG. 4, and the laminated green sheets 4 to 7 are attached by pressing as a job lot in the laminating direction X, a green monolithic block 13 is produced. The green sheet 6 having the conductive patterns 9 and 11 disposed thereon is sandwiched from both sides thereof by the plain green sheets 7 and is disposed in the lower position with respect to the laminating direction X. The ends of the conductive patterns 8 and 9 are exposed at one of the mutually opposing side surfaces of the monolithic block 13, and the ends of the conductive patterns 9, 10, and 11 are exposed at the other side surface. Then, the monolithic piezoelectric body 37 is completed by sintering the monolithic block 13.

Figure 6:
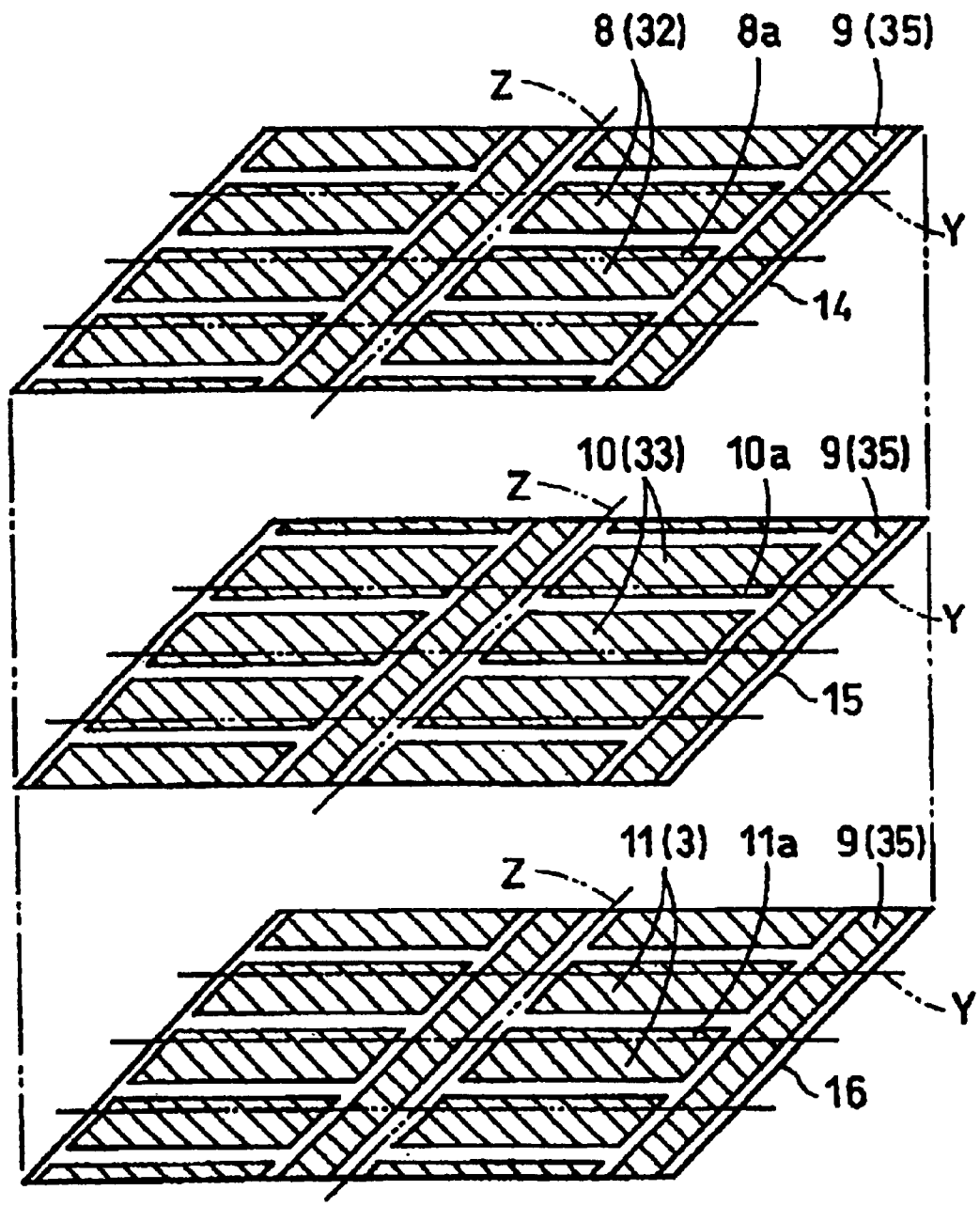
FIG. 6 is an exploded perspective view illustrating a method for manufacturing a large number of the monolithic piezoelectric bodies at the same time.

Although the manufacturing method in FIG. 4 illustrates a procedure for producing the monolithic piezoelectric body 37 one by one, a large number of the monolithic piezoelectric body 37 are manufactured at once in a commercial manufacturing process according to the following procedure. That is, as shown in FIG. 6, a large green sheet 14 having a large number of sets of the conductive patterns 8 and 9 disposed substantially parallel to each other thereon, a large green sheet 15 having a large number of sets of the conductive patterns 9 and 10 disposed substantially parallel to each other thereon, and a large green sheet 16 having a large number of sets of the conductive patterns 9 and 11 disposed substantially parallel to each other thereon are prepared. Subsequently, when the green sheets 14 and 15, each having a predetermined number of sheets, are alternately laminated, the green sheet 16 is laminated, and then these sheets 14, 15, and 16 are attached by pressing in the laminating direction, a green mother substrate block having a size corresponding to the size in which a large number of the monolithic blocks 13 are arranged substantially parallel to each other are produced.

Then, although not shown, when the mother substrate block is sintered, a mother substrate including the monolithic piezoelectric bodies 37 arranged continuously substantially parallel to each other, and which are to be individualized by cutting, is produced. Subsequently, when the upper and lower surfaces of the mother substrate are flattened by lap polishing or by surface grinding, and the mother substrate is divided along prescribed dividing lines Y and Z which divide the mother substrate into regions corresponding to the respective monolithic piezoelectric bodies 37, the individualized monolithic piezoelectric bodies 37 are achieved.

When the green sheets 14, 15, and 16 shown in FIG. 6 are laminated, sintered, and divided, the dividing lines Y and Z are sometimes displaced from the targeted positions as shown in FIG. 6, as a result, electrodes (not shown) including shreds 8a, 10a, and 11a which are, respectively, next to the conductive patterns 8, 10, and 11 may be formed in the monolithic piezoelectric bodies 37. However, it will be appreciated that such electrodes cause no problem at all in practical use.

Then, the monolithic block 13 is sintered so as to produce the monolithic piezoelectric body 37. Subsequently, when the driving external electrode 38 and the connecting external electrode 39 are formed on the first side surface 37a of the monolithic piezoelectric body 37, the common external electrode 41 is formed on the second side surface 37b thereof, and a prescribed polishing process is performed on these external electrodes, the laminated piezoelectric element 1 shown in FIGS. 1A and 1B is produced. In general, each of the external electrodes 38, 39, and 41 is preferably formed by screen printing with a conductive paste and then by baking or a thin film forming process such as depositing or sputtering.

Figure 7A:
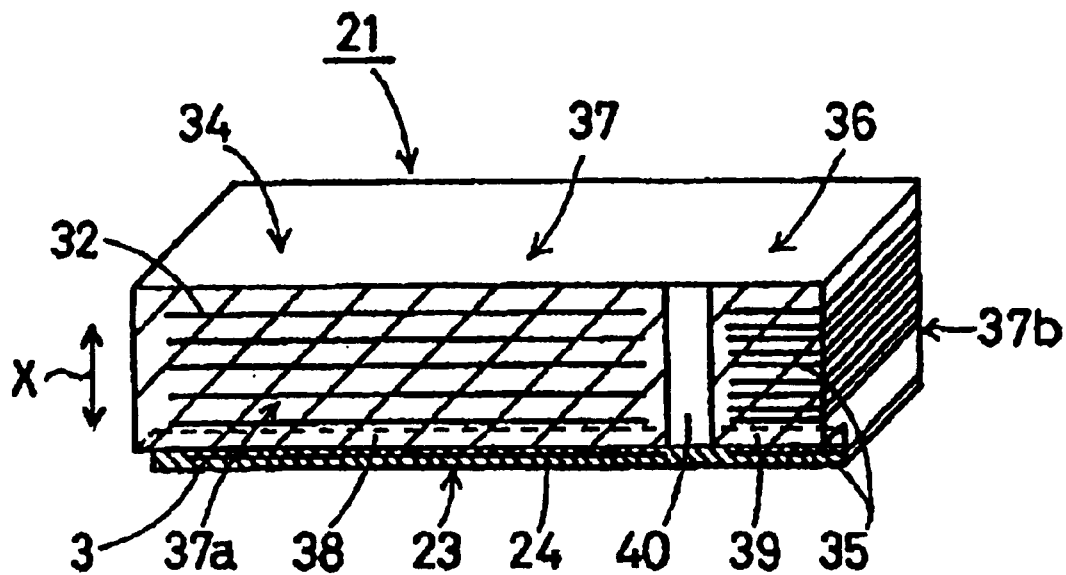
FIGS. 7A and 7B illustrate perspective views of an external shape of a second laminated piezoelectric element according to a second preferred embodiment of the present invention.
Figure 7B:
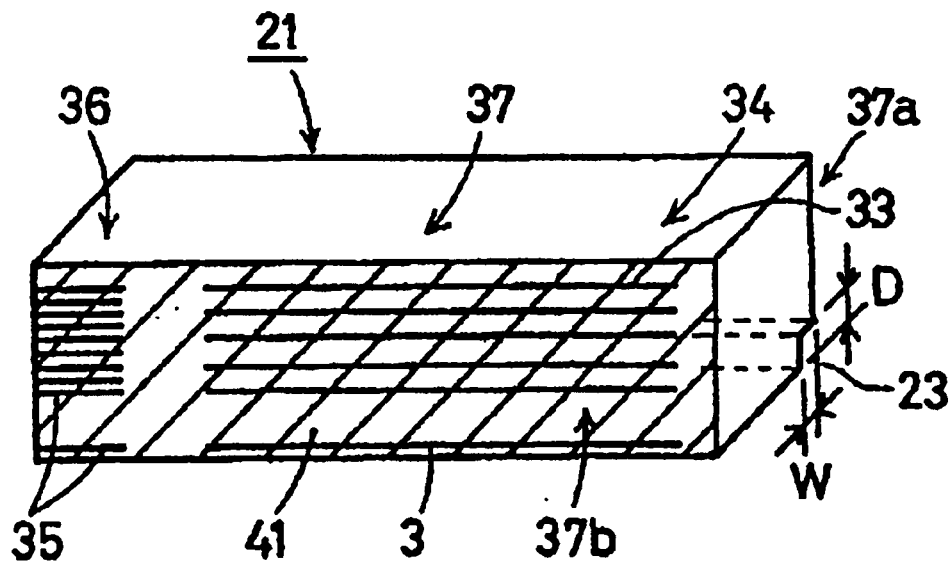
Figure 8:
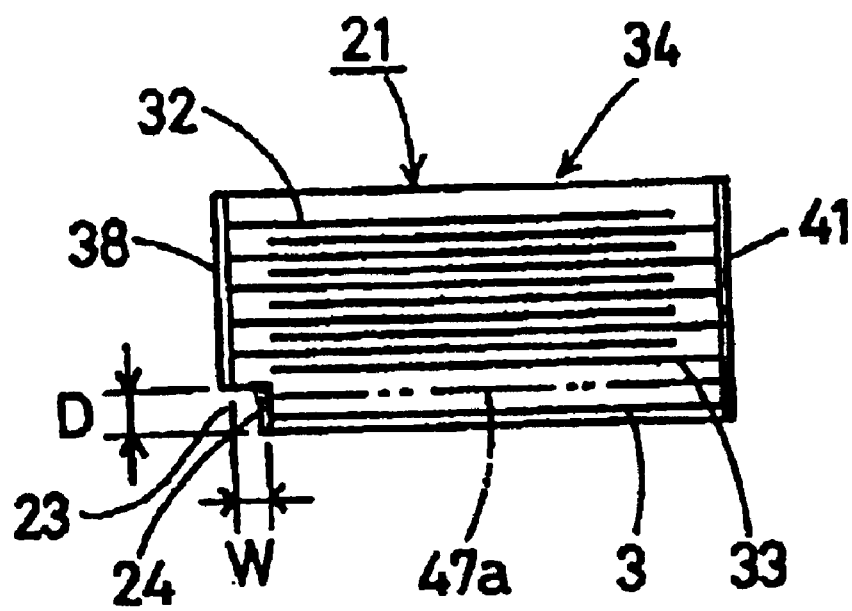
FIG. 8 is a cross-sectional view of a second drive of the second laminated piezoelectric element of FIGS. 7A and 7B.
Figure 9A:
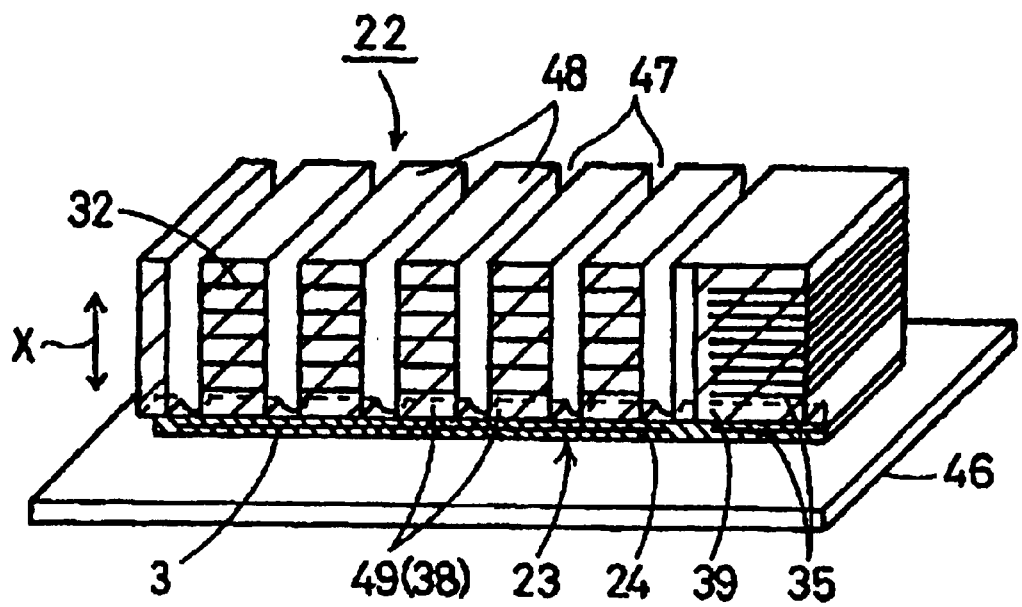
FIGS. 9A and 9B illustrate perspective views of a second piezoelectric actuator including the second laminated piezoelectric element of FIGS. 7A and 7B.
Figure 9B:
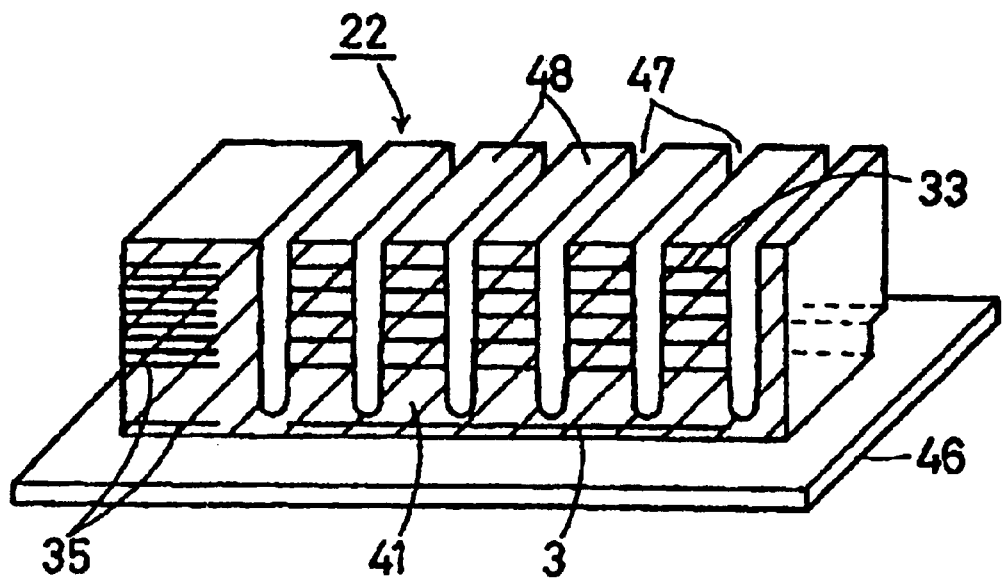
Figure 10:
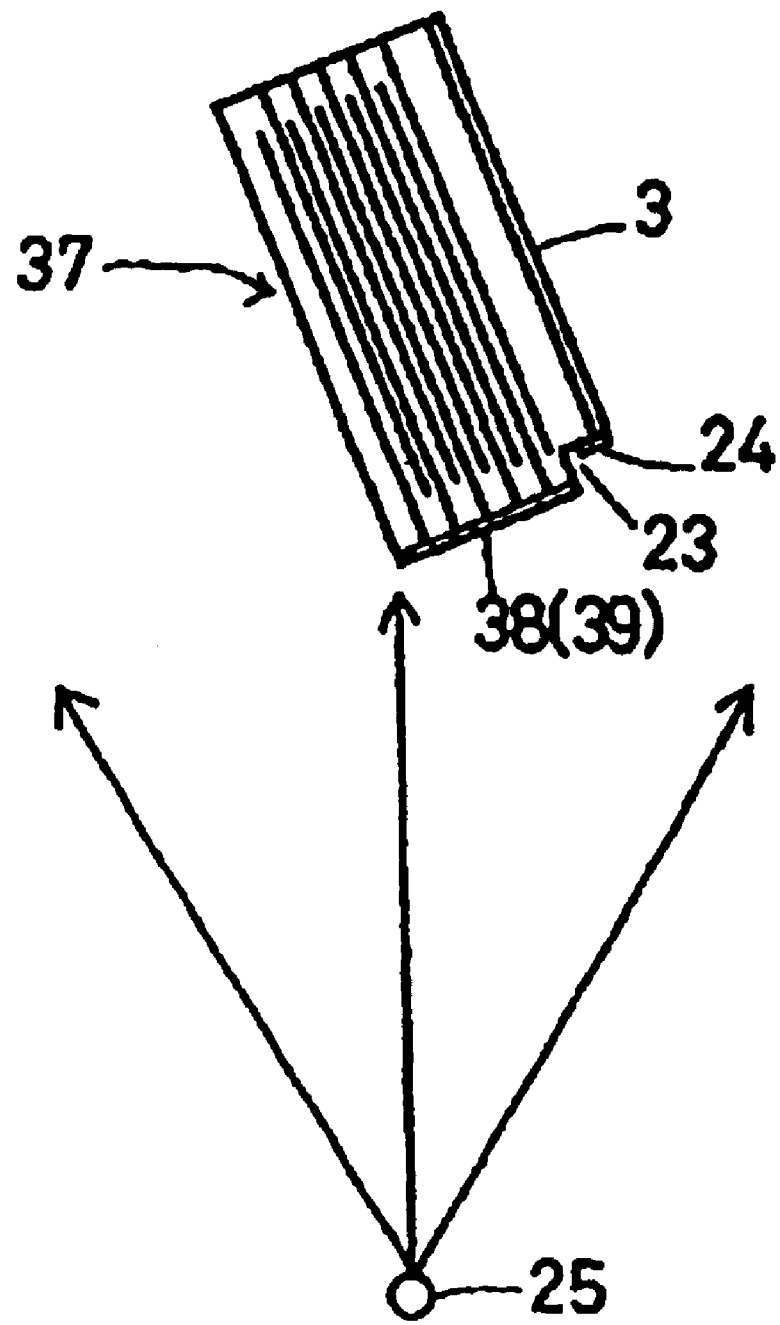
FIG. 10 is an illustration of an exemplary method for manufacturing an external electrode of the second laminated piezoelectric element.
Figure 11:
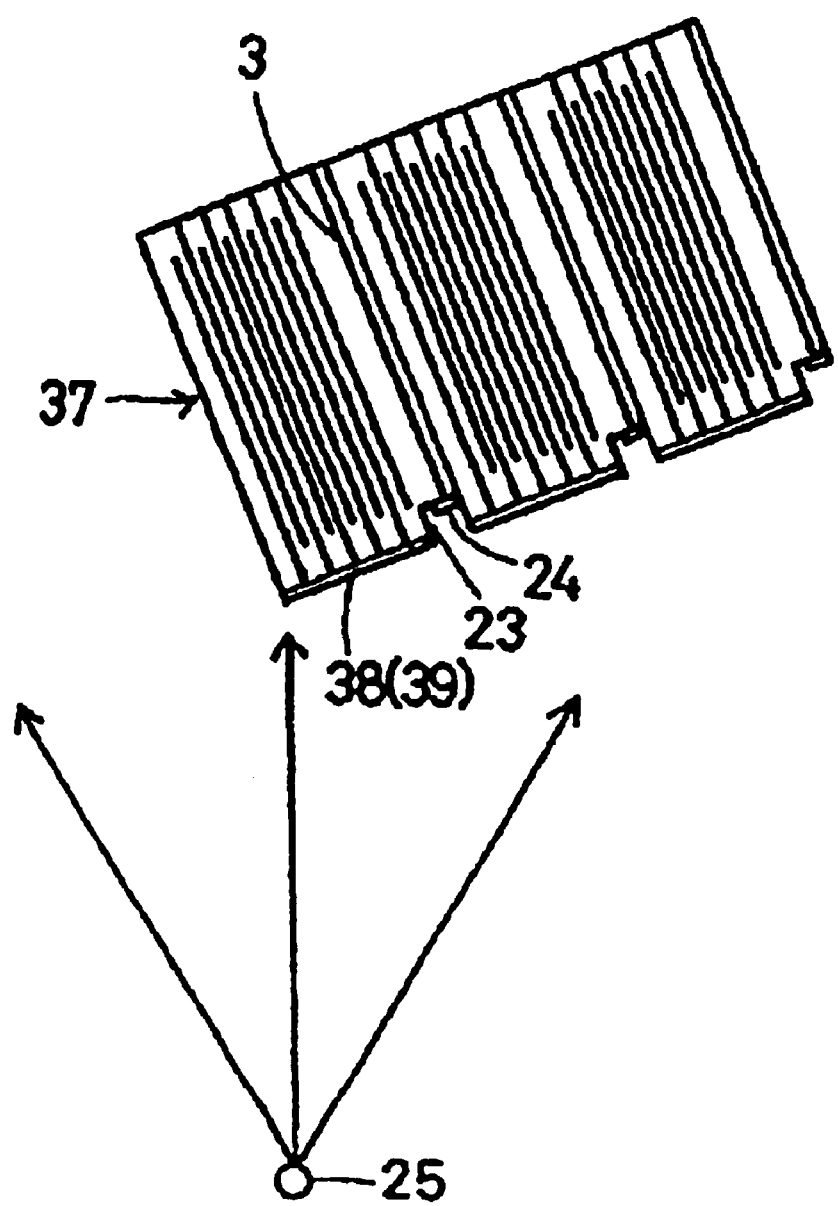
FIG. 11 is an illustration of another exemplary method for manufacturing the external electrode of the second laminated piezoelectric element.
Figure 12A:
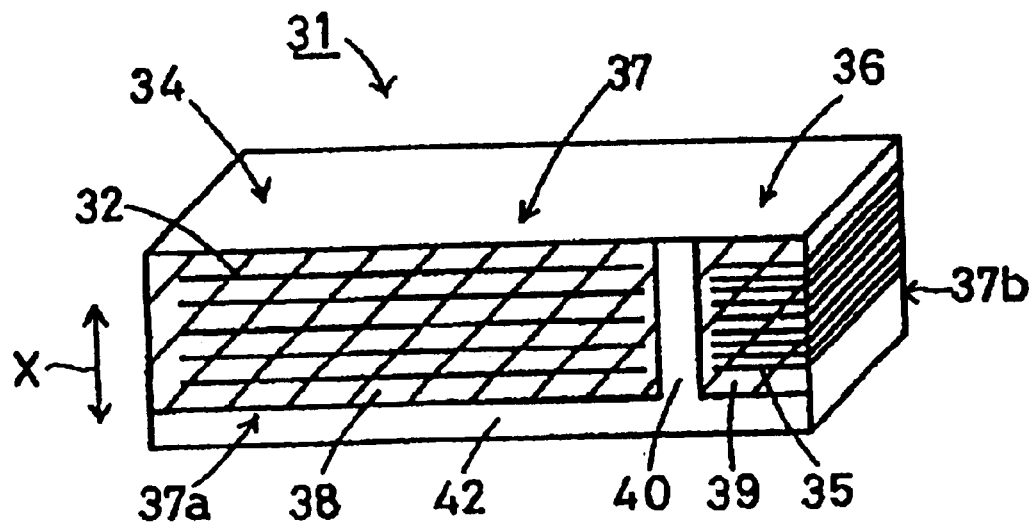
FIGS. 12A and 12B illustrate perspective views of an external shape of a known laminated piezoelectric element.
Figure 12B:
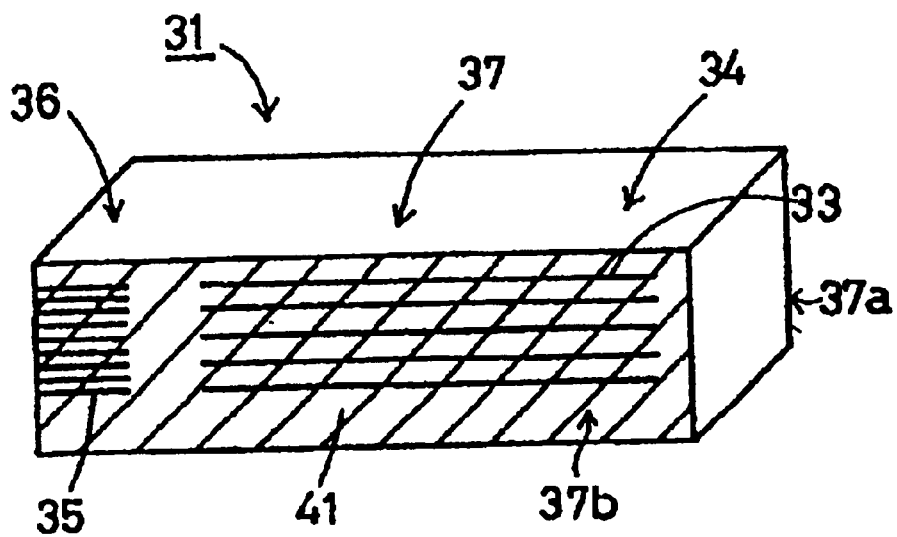
Figure 13:
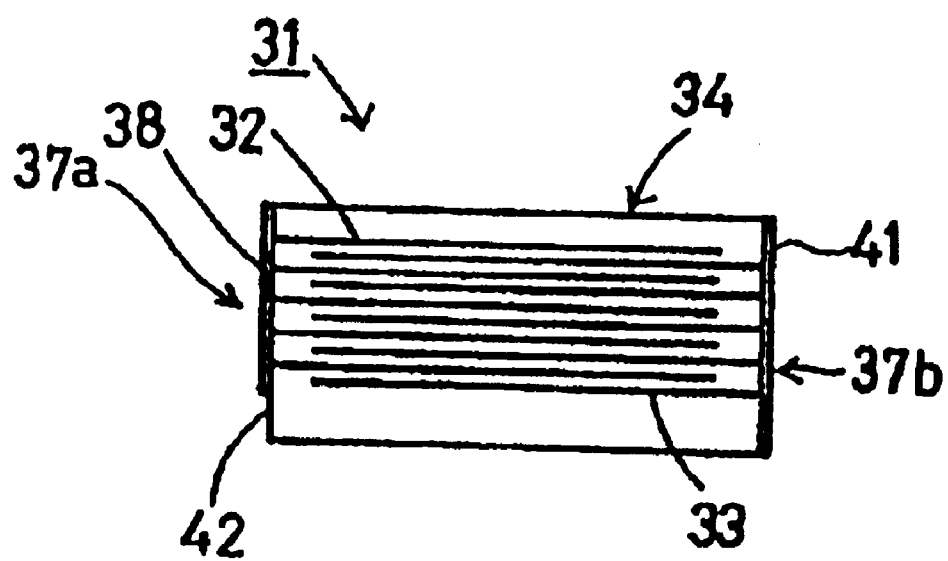
FIG. 13 is a cross-sectional view of a known drive of the known laminated piezoelectric element.
Figure 14A:
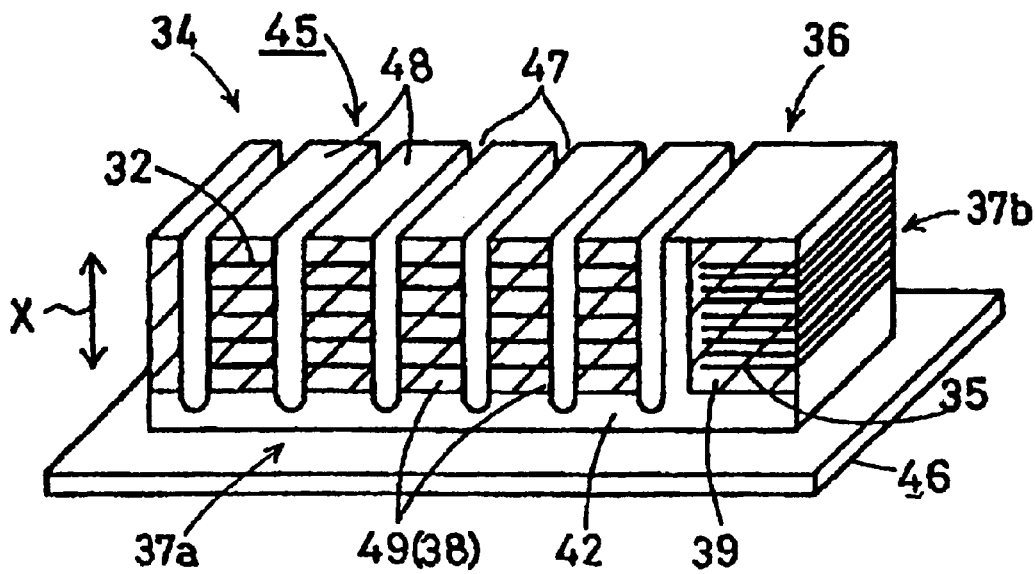
FIGS. 14A and 14B illustrate perspective views of a known piezoelectric actuator manufactured using the known laminated piezoelectric element.
Figure 14B:
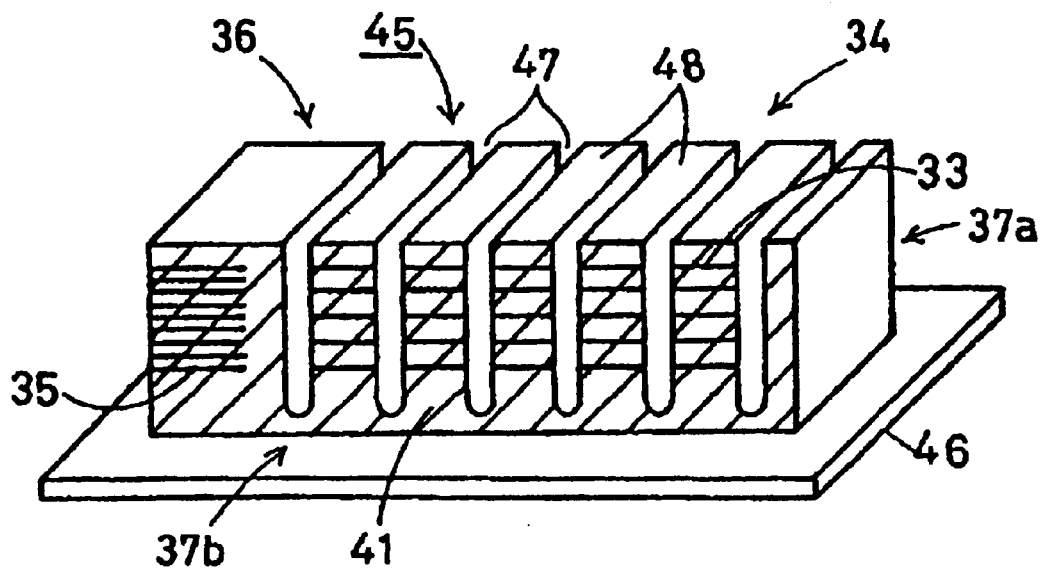

FIGS. 7A and 7B illustrate perspective views of an external shape of a second laminated piezoelectric element according to a second preferred embodiment of the present invention. FIG. 8 is a cross-sectional view of a driver of the second laminated piezoelectric element. FIGS. 9A and 9B illustrate perspective views of a second piezoelectric actuator including the laminated piezoelectric element. FIG. 10 is an illustration of an exemplary method for manufacturing an external electrode of the laminated piezoelectric element. Also, FIG. 11 is an illustration of another exemplary method for manufacturing the external electrode of the laminated piezoelectric element. Here, reference numerals 21, 22, 23, and 24 in FIGS. 7A to 9B denote a laminated piezoelectric element, a piezoelectric actuator, a notch, and a conducting external electrode, respectively.

The overall structure of the second laminated piezoelectric element according to the second preferred embodiment is basically the same as that of the first laminated piezoelectric element according to the first preferred embodiment except for the notch and the conducting external electrode formed therein. Therefore, like elements or corresponding elements in FIGS. 7A to 11B are denoted by the same reference numerals as in FIGS. 1A to 5, and detailed repetitive descriptions are omitted.

A laminated piezoelectric element 21 according to the second preferred embodiment is used for manufacturing a piezoelectric actuator 22. As shown in FIGS. 7A, 7B, and 8, the laminated piezoelectric element 21 includes the monolithic piezoelectric body 37 in which the first and second driving internal electrodes 32 and 33, and the first and second connecting internal electrodes 35 and 3 are laminated independently. Also, the monolithic piezoelectric body 37 has a notch 23 which is formed at the side surface 37a and which is open along the bottom edge thereof in the longitudinal direction thereof.

More particularly, the notch 23 is formed so as to have a substantially rectangular cross section which has a predetermined depth D extending from the lower surface of the monolithic piezoelectric body 37 and a predetermined width W as indicated in FIGS. 7B and 8, that is, the depth D extends in the height direction of the monolithic piezoelectric body 37 upward beyond the bottom edge 47a of the slits 47 formed when the piezoelectric actuator 22 is being manufactured but does not extend to the first and second driving internal electrodes 32 and 33. Also, the notch 23 is formed so as to be substantially parallel to the first and second driving internal electrodes 32 and 33 and also to the first connecting internal electrodes 35, all laminated in the monolithic piezoelectric body 37.

As shown in FIG. 7A, which illustrates the laminated piezoelectric element 21 viewed from one side thereof, ends of the first driving internal electrodes 32 are exposed at the first side surface 37a, but the other ends are not exposed at the second side surface 37b of the monolithic piezoelectric body 37. Also, as shown in FIG. 7B, which illustrates the laminated piezoelectric element 21 viewed from the other side thereof, ends of the second driving internal electrodes 33 are exposed at the second side surface 37b, but the other ends are not exposed at the first side surface 37a. The ends of first connecting internal electrodes 35 are exposed at both the first and second side surfaces 37a and 37b.

An end of the second connecting internal electrode 3 is exposed at the second side surface 37b, the other end is exposed at the side surface of the notch 23 formed at the first side surface 37a. The side surface of the notch 23, to which an end of the second connecting internal electrode 3 is exposed, has a conducting external electrode 24 disposed thereon for electrical connection with the second connecting internal electrode 3.

The driving external electrode 38 and the connecting external electrode 39 are substantially parallel to each other on the surface of the first side surface 37a of the monolithic piezoelectric body 37 except for the portion of the notch 23, with the spacing 40 interposed therebetween, while the common external electrode 41 is disposed on substantially the entire area of the second side surface 37b. The driving external electrode 38 and the connecting external electrode 39 are respectively in electrical connection with each of the driving internal electrodes 32 and each of the first connecting internal electrodes 35, and the common external electrode 41 is electrically connected to each of the second driving internal electrodes 33 and the second connecting internal electrode 3.

Accordingly, the second connecting internal electrode 3 is electrically connected to both the common external electrode 41 and the conducting external electrode 24. Thus, the driver 34 of the laminated piezoelectric element 21 according to the second preferred embodiment has a sectional structure shown in FIG. 8. A phantom line drawn in FIG. 8 indicates the position that is supposed to be the bottom edge 47a of the silts 47 formed by cutting when the piezoelectric actuator 22 is being manufactured. Although the second connecting internal electrode 3 as shown has only a single layer in FIGS. 7A to 9B, it is preferable that the second connecting internal electrode 3 have at least one layer.

The piezoelectric actuator 22 having the external shape shown in FIG. 9 is manufactured by using the laminated piezoelectric element 21. In the piezoelectric actuator 22, the plurality of actuator units 48 is configured such that the driver 34 of the laminated piezoelectric element 21 fixed on the support plate 46 is divided by the silts 47, which are formed by cutting from the upper surface toward the lower surface of the driver 34 in the laminating direction X indicated in FIGS. 7A and 9A. As shown in FIG. 9A, which illustrates the piezoelectric actuator 22 viewed from one side of thereof, by being divided by the slits 47, the driving external electrode 38 defines the plurality of unit external electrodes 49 corresponding to the respective actuator units 48. It will be appreciated that the slit 47 may divide the driver 34 from the connector 36 of the piezoelectric actuator 22. FIG. 9B illustrates the piezoelectric actuator 22 having such a configuration viewed from the other side of thereof.

In the laminated piezoelectric element 21, the first side surface 37a having the driving external electrode 38 and the connecting external electrode 39 disposed thereon has the notch 23 formed along the bottom edge thereof, and the notch 23 has the conducting external electrode 24 disposed on the side surface thereof for electrical connection with the second connecting internal electrode 3. Similar to the first preferred embodiment, in the piezoelectric actuator 22 including the laminated piezoelectric element 21, there is no risk that the second connecting internal electrode 3 disposed at the bottom portion of the monolithic piezoelectric body 37 and electrically connected to the common external electrode 41 is divided by the slits 47.

Accordingly, even when the conducting path 41a of the common external electrode 41 becomes narrow by forming the slits by cutting, the second connecting internal electrode 3 which is electrically connected to both the common external electrode 41 and the conducting external electrode 24 maintains the electrical connection between any two of the actuator units 48. As a result, there is no risk of an increase in electrical resistance between any two of the actuator units 48 and a decrease in conductivity of the overall piezoelectric actuator 22.

Referring now to FIGS. 10 and 11, which are illustrations of a method for forming the conducting external electrodes, a method for manufacturing the laminated piezoelectric element 21 will be described. Since the method for manufacturing the monolithic piezoelectric body 37 that defines the laminated piezoelectric element 21 is basically the same as that in the first preferred embodiment described by referring to FIG. 4, detailed repetitive descriptions will be omitted.

More particularly, as in the first preferred embodiment, when the monolithic piezoelectric body 37 that defines the laminated piezoelectric element 21 is being manufactured, the green sheets 4 to 7 having the conductive patterns 8 to 11, respectively, are prepared, laminated, and attached by pressing as a job lot. The green monolithic block 13 is manufactured in this manner, and then the monolithic piezoelectric body 37 is manufactured by sintering the monolithic block 13.

Although not shown, in an actual manufacturing process, the individual monolithic piezoelectric body 37 is generally manufactured such that a mother substrate block having a size corresponding to the total size of a large number of the monolithic blocks 13 is manufactured by laminating and attaching by pressing a plurality of large green sheets, each having the conductive patterns 8 to 11 disposed substantially parallel to each other thereon lengthwise and crosswise, a mother substrate which is a partially finished product is produced by sintering the mother substrate block, and the mother substrate is divided along prescribed dividing lines. Therefore, by forming a cut-in groove which is to form the notch 23 by dicing or other suitable process in every region which is to form each of the monolithic piezoelectric bodies 37, ahead of dividing the mother substrate, the notch 3 is formed in each of the monolithic piezoelectric bodies 37.

Then, as shown in FIG. 10, the driving external electrode 38, the connecting external electrode 39, and the conducting external electrode 24 are formed by accreting a metal material suitable for the external electrodes on the first side surface 37a by depositing, while supporting the individualized monolithic piezoelectric body 37 at a predetermined angle. That is, when these external electrodes 38, 39, and 24 are being formed, the monolithic piezoelectric body 37 is supported such that the notch 23 is kept away from a deposition source 25 and such that the first side surface 37a faces the deposition source 25.

Furthermore, when the monolithic piezoelectric body 37 is supported in such a slanted state, the side surface of the notch 23 also faces the deposition source 25, allowing the notch 23 to have the conducting external electrode 24 on the side surface thereof by depositing. Although the deposition source 25 in the illustration is a point here, it is not limited to a point but may be a flat surface.

Subsequently, forming the common external electrode 41 on the second side surface 37b opposing the first side surface 37a having the driving external electrode 38, the connecting external electrode 39, and the conducting external electrode 24 thereon, and polarizing the driver 34 by applying a voltage between the driving external electrode 38 and the connecting external electrode 39 completes the laminated piezoelectric element 21 according to the second preferred embodiment. One skilled in the art will appreciate that these external electrodes 24, 38, 39, and 41 are not necessarily formed by depositing, and may be formed by sputtering.

Moreover, in the foregoing description of the formation of the notch 23, the cut-in groove is formed in every region of the mother substrate which is to define each of the monolithic piezoelectric bodies 37. However, the present invention is not limited to such a method, and the notch 23 may be formed by the following method. That is, first the monolithic piezoelectric bodies 37 are obtained by dividing the mother substrate. Then, these individualized monolithic piezoelectric bodies 37 are stacked in the laminating direction, and the cut-in groove which is to form the notch 23 is formed in each of the stacked monolithic piezoelectric bodies 37, wherein the cut-in groove is formed also by dicing or other suitable process.

Then, as shown in FIG. 11, by accreting a metal material suitable for the external electrodes on the first side surfaces 37a of the monolithic piezoelectric bodies 37 by depositing while supporting the stacked monolithic piezoelectric bodies 37 at a predetermined angle, the driving external electrode 38, the connecting external electrode 39, and the conducting external electrode 24 are formed in the same fashion as described above. Subsequently, forming the common external electrode 41 on the second side surface 37b while the above external electrodes 38, 39, 24 are being formed on the first side surface 37a, and polarizing the driver 34 by applying a voltage between the driving external electrode 38 and the connecting external electrode 39 completes the laminated piezoelectric element 21 according to the second preferred embodiment.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A laminated piezoelectric element, comprising:
a monolithic piezoelectric body having at least one slit; and
a plurality of independently driven actuator units, the monolithic piezoelectric body including:
   a driver; and
   a connector, the driver including:
      a plurality of first driving internal electrodes; and
      a plurality of second driving internal electrodes, the first and second driving internal electrodes alternatively laminated therein, and the connector comprising:
         a plurality of first connecting internal electrodes laminated therein, the monolithic piezoelectric body further including:
            a driving external electrode;
            a connecting external electrode, the driving and connecting external electrodes disposed substantially parallel to each other on one of the mutually opposing side surfaces of the monolithic piezoelectric body and electrically connected to at least the first driving internal electrodes and the first connecting internal electrodes, respectively;
            a common external electrode disposed on the other of the mutually opposing side surfaces of the monolithic piezoelectric body and electrically connected to at least both the second driving internal electrodes and the first connecting internal electrodes; and
         a second connecting electrode being electrically connected with the common external electrode; wherein
            the silt extends from the upper surface toward the lower surface of the monolithic piezoelectric body in the laminating direction of the same, the actuator units are defined by the slit dividing the driving internal electrodes and the driving external electrode, and the second connecting internal electrode is disposed at a bottom portion, which lies below the bottom edge of the slit, of the monolithic piezoelectric body, and is spaced away from and substantially parallel to the first and second driving internal electrodes.

2. The laminated piezoelectric element according to claim 1, wherein the first and second driving internal electrodes are defined by printed patterns which are flat and have substantially the same shape, and the second connecting internal electrode is defined by a printed pattern which is flat and has substantially the same shape as that of the driving internal electrodes.

3. The laminated piezoelectric element according to claim 1, wherein the second connecting internal electrode is flat and has a shape substantially the same as that of the second driving internal electrodes.

4. The laminated piezoelectric element according to claim 1, further comprising;
   a notch formed on a side surface of the monolithic piezoelectric body that has the driving external electrode and the connecting external electrode disposed thereon; and
   a conducting external electrode which is electrically connected to the second connecting internal electrode and which is disposed on the side surface of the notch; wherein
      the notch extends from the lower surface of the monolithic piezoelectric body upward beyond the bottom edge of the slits, but does not extend to the first and second driving internal electrodes, and is substantially parallel to the driving internal electrodes and the first connecting internal electrodes, and one end of the second connecting internal electrode is exposed at the side surface of the notch.

5. The laminated piezoelectric element according to claim 1, wherein ends of the first driving internal electrodes are disposed at a first of two mutually opposing side surfaces of the monolithic piezoelectric body and ends of the second driving internal electrodes are disposed at a second of two mutually opposing side surfaces of the monolithic piezoelectric body.

6. The laminated piezoelectric element according to claim 1, wherein the second connecting internal electrode is substantially perpendicular to the laminating direction.

7. The laminated piezoelectric element according to claim 1, wherein the second connecting internal electrode has a width that is substantially the same as that of the first and second driving internal electrodes.

8. The laminated piezoelectric element according to claim 1, wherein the second connecting internal electrode is defined by at least one layer.

9. The laminated piezoelectric element according to claim 1, wherein a first end of the second connecting internal electrode is exposed at one of two mutually opposite side surfaces of the monolithic piezoelectric body and a second end of the second connecting internal electrode is not exposed at one of two mutually opposite side surfaces of the monolithic piezoelectric body.

10. The laminated piezoelectric element according to claim 1, wherein the driving external electrode and the connecting external electrode are respectively in electrical connection with each of the first driving internal electrodes and each of the first connecting internal electrodes.

11. The laminated piezoelectric element according to claim 1, wherein the common external electrode disposed on substantially an entire side surface of the monolithic piezoelectric body and is commonly electrically connected to the second driving internal electrodes 33 and the first and second connecting internal electrodes.

12. The laminated piezoelectric element according to claim 1, wherein the common external electrode is connected to the connecting external electrode.

13. The laminated piezoelectric element according to claim 4, wherein the notch has a substantially rectangular cross section and has a predetermined depth extending from the lower surface of the monolithic piezoelectric body upward beyond the bottom edge of the slit but does not extend to the first and second driving internal electrodes.

14. The laminated piezoelectric element according to claim 1, wherein the notch 23 is substantially parallel to the first and second driving internal electrodes and to the first connecting internal electrodes.

15. A method for manufacturing the laminated piezoelectric element according to claim 4, comprising the steps of:

supporting the monolithic piezoelectric body, having the notch formed therein, in a slanted state with respect to a depositing source or a sputtering source; and forming the driving external electrode, the connecting external electrode, and the conducting external electrode in a lump.

16. A piezoelectric actuator comprising the laminated piezoelectric element according to claim 1, wherein the driver of the monolithic piezoelectric body is divided by the slit extending from the upper surface toward the lower surface of the monolithic piezoelectric body, and the plurality of independently driven actuator units are defined by the slit dividing the first and second driving internal electrodes, which are laminated in the driver.

* * * * *